United States Patent [15] 3,639,813

Kamoshida et al. [45] Feb. 1, 1972

[54] COMPLEMENTARY ENHANCEMENT AND DEPLETION MOSFETS WITH COMMON GATE AND CHANNEL REGION, THE DEPLETION MOSFET ALSO BEING A JFET

[72] Inventors: Mototaka Kamoshida; Sho Nakanuma, both of Tokyo, Japan

[73] Assignee: Nippon Electric Company, Limited, Tokyo, Japan

[22] Filed: Apr. 14, 1970

[21] Appl. No.: 28,325

[30] Foreign Application Priority Data

Apr. 15, 1969 Japan....................................44/30130

[52] U.S. Cl.......................317/235 R, 317/235 A, 317/235 B, 317/235 D, 317/235 G, 317/235 Z

[51] Int. Cl.....................H01l 13/00, H01l 19/00, H01l 5/06, H01l 11/14

[58] Field of Search.........................317/235 B, 235 A, 235 G; 307/304

[56] References Cited

UNITED STATES PATENTS

| | | | |
|---|---|---|---|
| 3,440,503 | 4/1969 | Gallagher | 317/235 |
| 3,283,221 | 11/1966 | Heiman | 317/235 |
| 3,541,678 | 11/1970 | McDonald | 317/235 |

OTHER PUBLICATIONS

McDowell, " MOS Substrate as Control Element," IBM Technical Disclosure Bull., Vol. 10 No. 7, Dec. 1967, page 1032

*Primary Examiner*—John W. Huckert
*Assistant Examiner*—William D. Larkins
*Attorney*—Sandoe, Hopgood & Calimafde

[57] ABSTRACT

A semiconductor device comprising a pair of FET's having a common electrode has operating characteristics similar to paired complementary FET's. In one embodiment of the invention the device functions as paired IGFET's, having a common gate electrode, and in a second embodiment the device functions to couple an IGFET to a JGFET.

6 Claims, 9 Drawing Figures

INVENTORS
MOTOTAKA KAMOSHIDA
SHO NAKANUMA
BY
Sandoe, Hopgood & Calimafde
ATTORNEYS INVENTORS
MOTOTAKA KAMOSHIDA
SHO NAKANUMA
BY
Sandoe, Hopgood & Calimafde
ATTORNEYS INVENTORS
MOTOTAKA KAMOSHIDA
SHO NAKANUMA
BY
Sandoe, Hopgood & Calimafde
ATTORNEYS

COMPLEMENTARY ENHANCEMENT AND DEPLETION MOSFETS WITH COMMON GATE AND CHANNEL REGION, THE DEPLETION MOSFET ALSO BEING A JFET

The present invention relates to semiconductor devices and, more particularly, to an insulated gate-type field effect semiconductor device having a pair of complementary field effect transistors (FET's). For convenience of explanation, an insulated gate-type field effect transistor and a junction-type gate field effect transistor will be abbreviated hereinafter to IGFET and JGFET, respectively.

A bipolar type transistor or an IGFET may be used as an active constituent element in an integrated circuit device consisting of logic circuits. Circuits using IGFET's have recently been developed particularly because the IGFET is economical in fabrication and readily adapted to large-scale integration techniques. When IGFET's are used in an integrated circuit, they are usually only composed of IGFET's of the same channel type. P-channel enhancement type IGFET's are used generally because of their greater ease in fabrication.

The use of complementary pairs of IGFET's in which P-channel type and N-channel type FET's are formed within a common semiconductor substrate, has numerous advantages such as an increased switching speed. However, the use of complementary FET's requires isolating means between the semiconductor regions forming the respective IGFET's, and it is very difficult to give the same electric characteristics to the paired complementary FET's.

It is therefore an object of the present invention to provide a novel semiconductor device which operates similar to the complementary type element.

It is another object of the present invention to reduce the area occupied in a semiconductor substrate by paired field effect transistors, while achieving an increased degree of integration and higher speed of response.

Briefly, a semiconductor device according to the present invention functions in one aspect as paired IGFET's having gate electrodes connected in common. In another aspect of the invention the semiconductor device functions to couple an IGFET to a JGFET. In the latter case, some of the electrodes of the FET's are used in common so that the IGFET and JGFET may be arranged in a common plane. However, when seen in the sectional view, the IGFET's are arranged in a vertically stacked state with respect to the major plane of the semiconductor substrate.

The present invention makes it possible to fabricate a complementary IGFET's structure occupying in a much smaller area than in conventional devices of this kind. More particularly, in the case in which the IGFET's are formed in the stacked state, the area occupied in the substrate by the device is reduced by as much as one half, thus making it possible to remarkably improve the degree of integration. Even in the case where the IGFET's are formed in a side-by-side arrangement, the degree of integration is improved because the electrodes can be used in common.

To the accomplishment of the above and to such further objects as may hereinafter appear, the present invention relates to an insulated gate type field effect semiconductor device substantially as defined in the appended claims and as described in the accompanying specification taken together with the accompanying drawings, in which:

Figure 1:
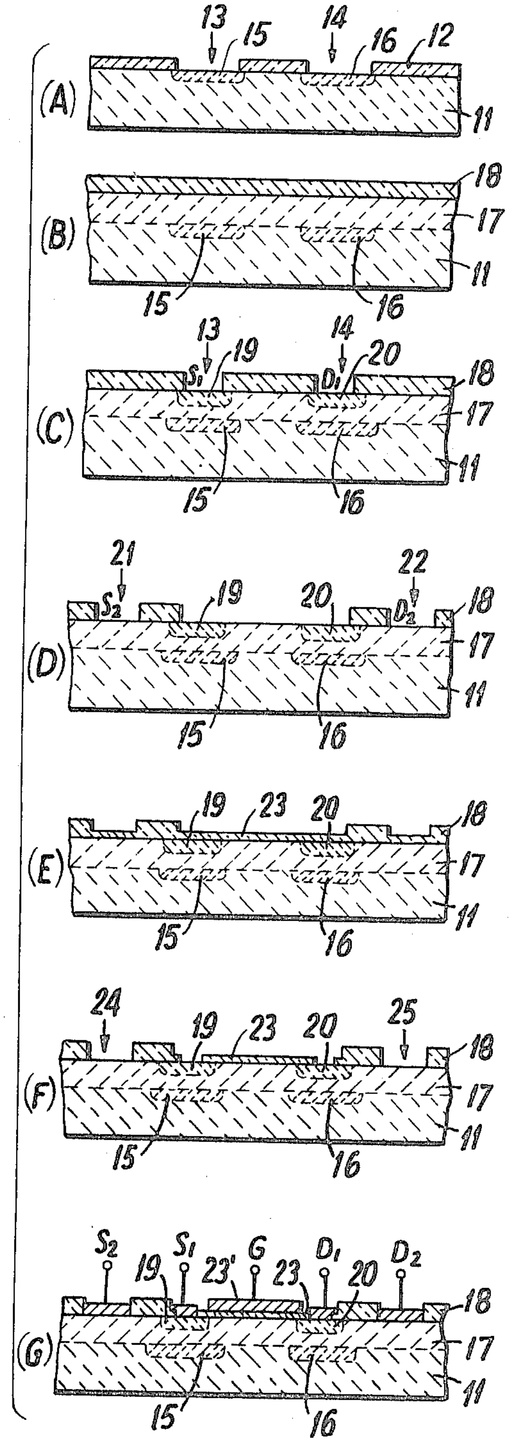
FIG. 1 illustrates, in cross section, the various steps in the manufacturing process of a semiconductor device according to a first embodiment of the present invention.

Referring to FIGS. 1A–1G, cross-sectional views of a silicon wafer are shown in the order of the steps of a process for fabricating a semiconductor device according to one aspect of the invention. In the semiconductor device fabricated along these lines, an upper IGFET of the superimposed pair of IGFET's functions as a P-channel type FET. First, a silicon dioxide layer 12 is formed on a P-type silicon substrate 11 such as by the well-known dioxide deposition process. Then, as shown in FIG. 1A, the silicon dioxide layer 12 is selectively removed at portions 13 and 14 corresponding to those areas which are to be source and drain regions. Opposite-type impurities are then diffused into the substrate to form highly doped $N^+$layers 15 and 16. Next, as shown in FIG. 1B, the silicon dioxide layer 12 is removed to form an N-type silicon layer 17, and in insulation layer 18 is then formed on the surface of layer 17, also by a conventional process. After this process the insulating layer 18, as shown in FIG. 1C is removed at portions 13, 14 to diffuse P-type impurities into the substrate to form source and drain regions 19 and 20. In order to distinguish these electrodes from the source and drain electrodes of the other IGFET to be formed later, the source electrode for region 19 and the drain electrode for region 20 are designated $S_1$ and $D_1$, while the corresponding electrodes of the other IGFET are designated $S_2$ and $D_2$, respectively. The insulating layer 18 is then, as shown in FIG. 1D, selectively removed at the area which is to be a gate electrode, and at areas 21 and 22, which are to be a source electrode $S_2$ and a drain electrode $D_2$ of the other IGFET. The selective etching of the insulating layer 18 may be carried out by any of the known techniques. An insulating layer 23 of the gate portion is then formed on layer 17 as shown in FIG. 1E so that a desired threshold voltage may be obtained. Electrode openings 24 and 25 for electrodes $S_2$ and $D_2$ are further formed together with electrode openings for electrodes $S_1$ and $D_1$. Thus, a thin piece for a semiconductor device is finished as shown in FIG. 1F. Electrode metals are attached thereto by a well-known process, and the device is completed in the form shown in FIG. 1G. In case where the device is incorporated into an integrated circuit, suitable isolation regions may be formed.

Figure 2:
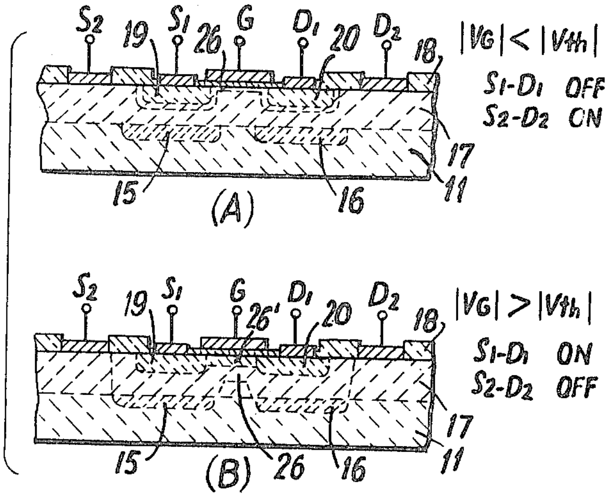
FIGS. 2A and 2B are cross-sectional view illustrating the operation of the semiconductor device.

The structure of the completed embodiment is shown in FIG. 1G. In operation, a gate voltage $V_G$ applied to the gate electrode 23' at a level below the gate threshold voltage $V_{th}$ specific to the insulated gate structure including insulator film 23 and substrate 17 does not cause current to flow between source and drain electrodes $S_1$ and $D_2$. In other words, the first or upper FET is in the OFF state, while the second or lower FET is in the ON state, allowing current to flow between the source and drain electrodes $S_2$ and $D_2$ of the latter. When the gate voltage $V_G$ is increased to a value above the threshold voltage $V_{th}$, a conductive channel 26' is formed between the source and drain electrodes of the first FET (FIG. 2B) so that current is caused to flow between the source and drain electrodes $S_1$ and $D_1$ of the upper FET. At the same time, the depletion layer 26 reaches P-type substrate 11 so that no current is caused to flow between source and drain electrodes $S_2$ and $D_2$, keeping the second FET in the OFF state as shown in FIG. 2B. In this way, when one of the first and second FETs is in the ON state, the other FET turns OFF, except for the transition state therebetween. This operation is illustrated in an electronic circuit diagram shown in FIG. 3, and the relationship between the voltage and current in the first and second FET's are respectively graphically illustrated in FIGS. 4A and 4B. Thus, the semiconductor device of FIG. 1G functions quite similarly to that of complementary paired IGFET's.

In order for the semiconductor device of the invention to be operative, the depletion layer under the gate electrode film should extend to a level deeper than the depletion layer extending from the source electrode $S_1$ and drain electrode $D_1$. However, if the impurity concentration in the N-type silicon layer 17 is raised so that the extension of the depletion layers from the source $S_1$ and drain $D_1$ is prevented, formation of an inversion layer (conduction channel) under the gate becomes difficult. For this reason, it is a key point in realizing the present structure that the impurity concentration in the N-type layer 17 is raised to a certain limited extent. For facilitating the formation of the inversion layer under the gate, the impurity concentration in the N-type silicon layer 17 is selected to be $10^{15}/cm.^3$ As described in "Solid State Electronics," Vol. 9 (1966 ), pp. 783–806, by A. S. Grove and D. J. Fitzgerald, the maximum extended distance $X_{dmax}$ of the depletion layer under the gate can be expressed as $$X_{d\max}=\frac{2Ks\epsilon_0(V_j+2\phi_F)^{1/2}}{q(N_A-N_D)}$$

when no voltage is applied across the source electrode $S_1$ and the drain electrode $D_1$ and a certain voltage is applied to the gate electrode G. Here, $Ks$ denotes a specific dielectric constant of silicon; $\epsilon o$ denotes a dielectric constant; $V_j$ denotes a voltage applied across a surface simulated by a PN-junction; $0_F$ denotes the Fermi potential; $N_A$ and $N_D$ respectively denote the concentrations of acceptor and donor; and $q$ denotes the electric charge of an electron.

Assuming that $V_j+20_F=5V$ in the above equation, $X_{dmax}$ is calculated at about 1.8 microns. However, when IV is applied across the PN-junction formed between the N-type silicon layer 17 and either of the source $S_1$ and drain $D_1$, $X_{dmax}$ becomes extended to 4.5 microns. For suppressing the extension of the depletion layers under the source electrode $S_1$ and the drain electrode $D_1$, N-type buried layers 15 and 16 of high impurity concentration are provided under the respective electrodes $S_1$ and $D_1$. Thus, the semiconductor device of the present invention is put into practice employing the buried layers ($N^+$ layers) 15 and 16. When the $N^+$ layers 15 and 16 are selected to be larger areas than the bottom areas of the depletion layers formed under the source electrode $S_1$ and the drain electrode $D_1$, respectively, the path between the source electrode $S_2$ and the drain electrode $D_2$ is maintained conductive even if the depletion layers formed under the source and the drain electrodes $S_1$ and $D_1$ extend to reach the $N^+$ layers 15 and 16.

Formation of N-type layer 17 of about 1.5 to 2 microns thickness is made possible with sufficient accuracy by the well-known epitaxial growth technique. The gate electrode and its neighboring portion can then be formed so that a desired threshold voltage is obtained in the resultant semiconductor device.

At this time, if the insulating layer for the gate electrode is formed of alumina, not only the value of the threshold voltage is lowered but the extension of the depletion layer is intensified because of the high dielectric constant of the alumina. In the case where the insulating layer is formed as described above, the N-type layers of high impurity concentration to be provided under the source electrode $S_1$ and the drain electrode $D_1$ are no longer needed. Also, the thickness of the epitaxial layer 17 may be made thicker or the specific resistance thereof may be made lower than as described above.

The principal technical advantage of the present structure lies in the fact that the area occupied by the paired complementary FET's is not greater than that required for only one such semiconductor element formed by the conventional technique. The degree of integration can be therefore significantly increased.

Figure 3:
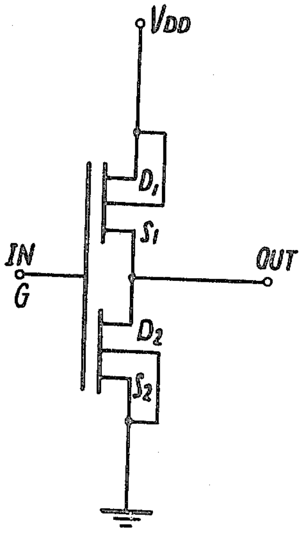
FIG. 3 is a circuit diagram of the field effect transistor of the first embodiment.
Figure 4:
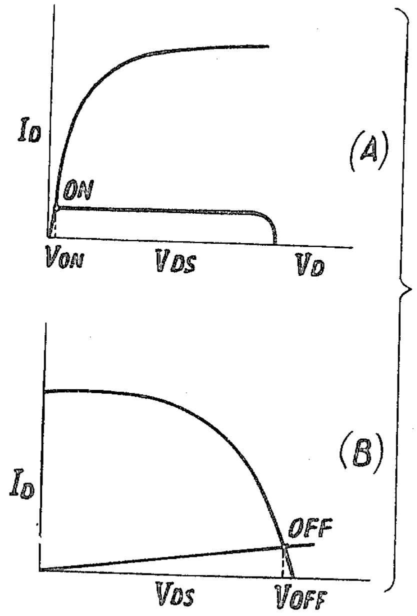
FIGS. 4A and 4B illustrate characteristic curves illustrating the operation of the field effect transistor.

Moreover, since the device can be operated as shown in FIG. 4, it can be employed in an inverter circuit with the element shown in FIG. 3 employed as the principal component element.

Figure 5:
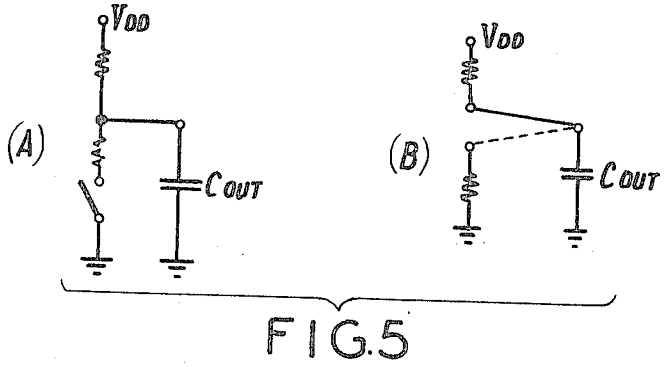
FIGS. 5A and 5B, 6 and 7 are circuit diagrams respectively illustrating the technical advantages of the present invention.

Furthermore, the inverter element formed in this manner operates as a single-pole double-throw switch. In contrast to the conventional semiconductor devices and particularly to a switch employing the conventional IGFET, shown by an equivalent circuit in FIG. 5A, the switch composed of the present device indicated by the equivalent circuit shown in FIG. 5B, has a short switching time because it is driven by the low resistance of the IGFET in its ON state. Thus, a semiconductor device having a function similar to the complementary IGFET circuit can be realized.

Figure 6:
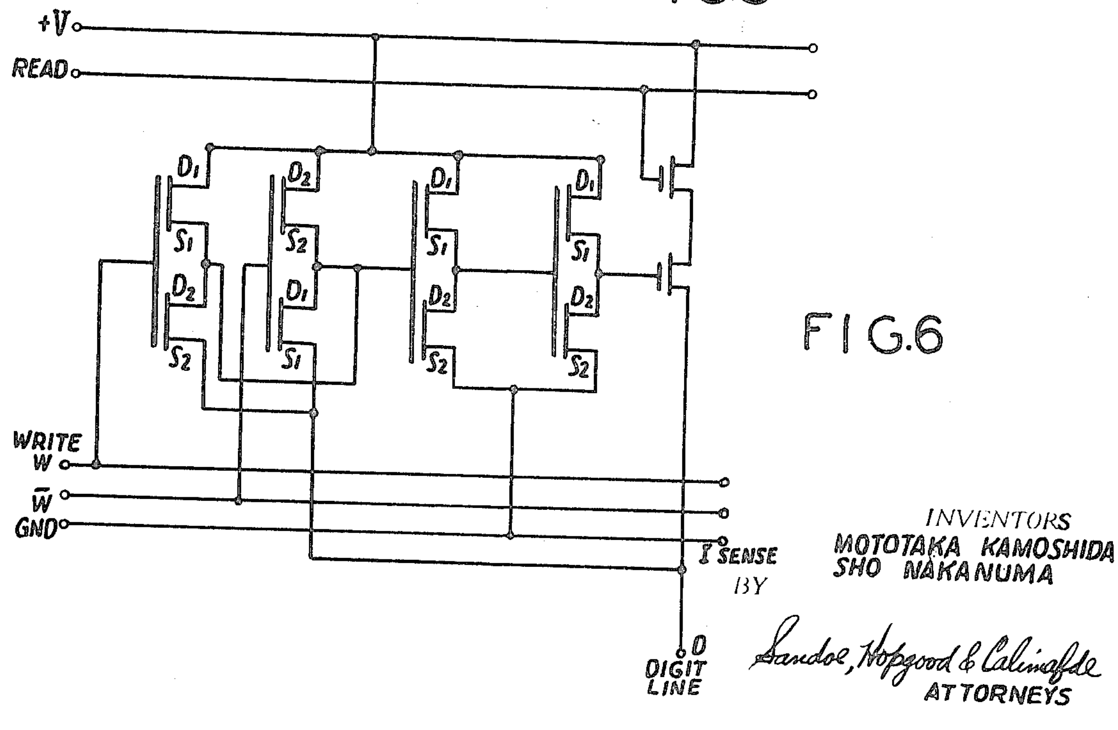

As shown in FIG. 6, four of the semiconductor elements of the invention can be utilized to fabricate a semiconductor memory device. Although the memory device is fundamentally equivalent to a complementary circuit employing eight IGFET's, the embodiment requires only four FET's rather than eight FET's needed in the conventional device. Furthermore, the circuit of the memory device includes a plurality of the circuit elements shown in FIG. 3, making high-speed operation possible.

It will be also noted that the present structure serves as a noncontact-point type relay utilizing the nature of the device wherein one FET becomes ON while the other FET becomes OFF.

Figure 7:
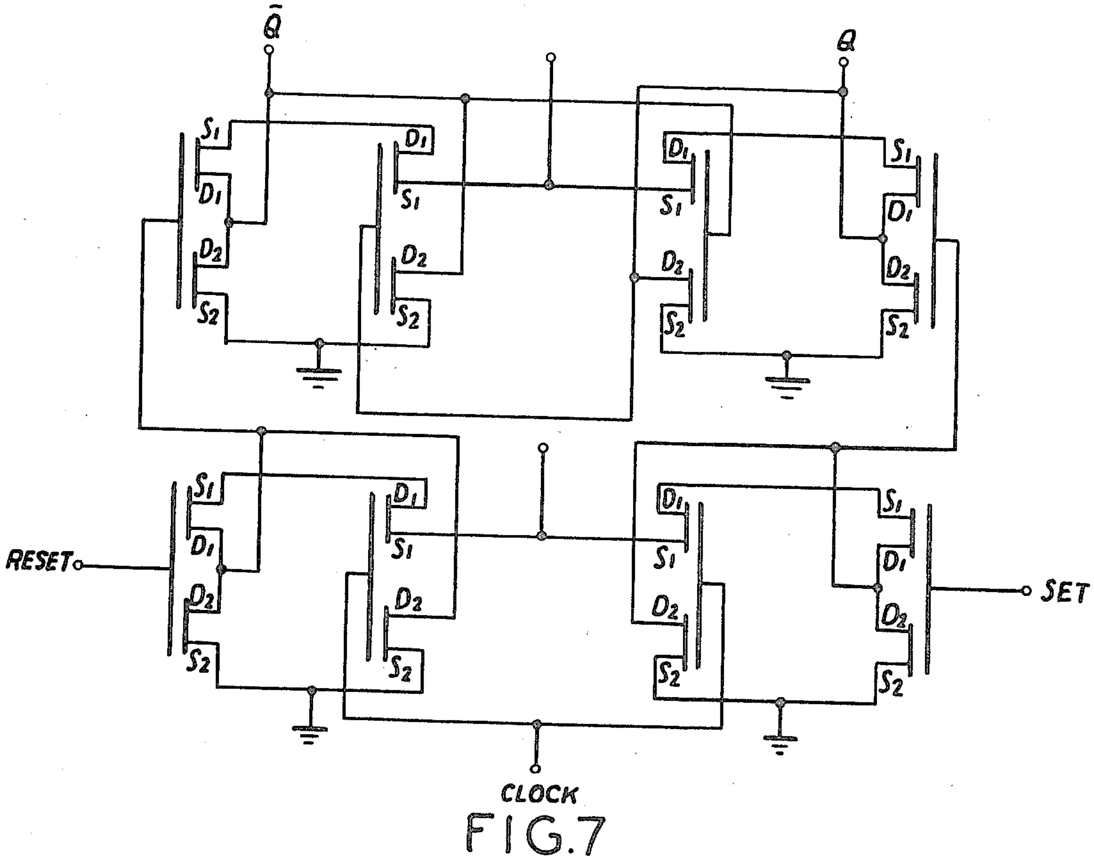

The present device may also serve as a flip-flop circuit. FIG. 7 shows a gate control type flip-flop circuit employing eight semiconductor elements, which replace 16 IGFET's needed in a conventional structure. The degree of integration is improved accordingly. It is widely known that the flip-flop circuit can be employed not only in an oscillation circuit but also in a memory circuit. Also, it may be employed in other applications such as in a shift register or the like.

Although the semiconductor device of the invention has so far been described as being formed on a P-type substrate, it will be apparent that an N-type substrate may be employed to equal advantage to form N-channel type FET's.

Moreover, the material utilized for the gate insulator film may be selected from various alternatives so that the device may be operative in the depletion mode as well as in the enhancement mode. Furthermore, the semiconductor substrate is not limited to silicon; any other semiconductor materials such as germanium or cadmium sulfate and the like may be employed as well. The above-mentioned substrate 11 may also be formed of a suitable insulating material such as sapphire.

A second embodiment of the present invention wherein the device works in a similar manner to the combined operation of an IGFET and a JGFET will now be explained with reference to FIG. 8. The manufacturing process of this embodiment is fundamentally similar to that of the first embodiment. However, in contrast to the first embodiment, this second embodiment is characterized in that the regions serving as the source or drain are sufficiently close to the semiconductor substrate so that the depletion regions for the source or drain electrodes are disposed at a distance, from which one or both of the source and drain depletion regions may be extended in operation to reach the semiconductor substrate. Accordingly, in this case, the process of providing layers having high concentration N-type impurity under the source electrode $S_1$ and the drain electrode $D_1$ as described in the first embodiment may be omitted.

Figure 8:
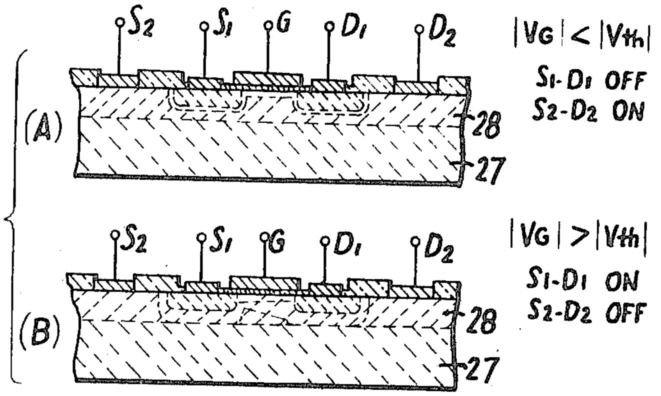
FIGS. 8A and 8B are cross-sectional views of a semiconductor device according to a second embodiment of this invention.
Figure 9:
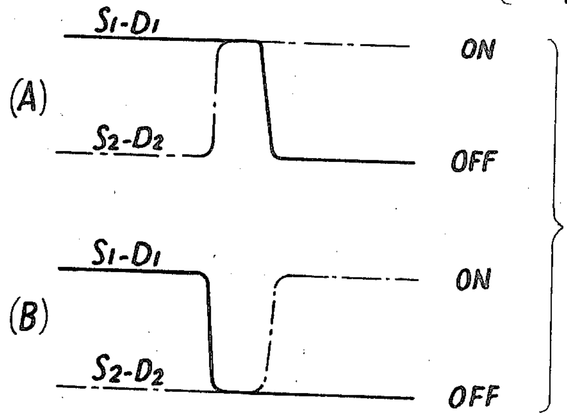
FIGS. 9A and 9B are waveform diagrams illustrating the differences in the operational characteristics between the devices of the first and second embodiments.

The principles of operation of the embodiment of FIG. 8 are illustrated in FIGS. 8 and 9. Since the depletion layers under the source electrode $S_1$ and drain electrode $D_1$ contribute more than those under the gate electrode to the control of the current flowing between the second source electrode $S_2$ and drain electrode $D_2$, the FET having the second source electrode $S_2$ and the second drain electrode $D_2$ acts as if it were a JGFET having the junction portion of the source electrode $S_1$ and the drain electrode $D_1$ as its gate portion. A fundamental difference in connection with the second embodiment from the first embodiment is that the input signal is applied to the first drain electrode $D_1$ from which the depletion layer is likely to be extended to the deepest electrode position. In operation, when the IGFET including source electrode $S_1$ gate electrode G, and drain electrode $D_1$ is in the OFF state as indicated in FIG. 8A while another semiconductor element including source and drain electrodes $S_2$ and $D_2$ is in the ON state. When the element between source and drain electrodes $S_1$ and $D_1$ is placed in the ON state as indicated in FIG. 8B, the element between source and drain electrodes $S_2$ and $D_2$ is brought to the OFF state.

Accordingly, the stable operating states of the second embodiment are quite similar to the first embodiment of the invention, although the transient state of the second embodiment is different from the first embodiment. In the transient state, there is a time interval where the current for both of the transistors is reduced to nearly zero. FIGS. 9A and 9B show the transient conditions at the time the current flowing through the element having source and drain electrodes $S_1$ and $D_1$ is transferred from its ON to its OFF state, with time being represented on the abscissa. The curve of FIG. 9A illustrates the operation of the device of the first embodiment and that of FIG. 9B illustrates the operation of the device of the second embodiment of the invention.

As is apparent from the drawings, the same advantageous feature as the above-described complementary elements can be obtained by the second embodiment wherein some of the electrodes are employed commonly to both of the elements. With the above-described structure of the semiconductor device, the area occupied by the paired FET's can be reduced by the amount corresponding to the commonly employed portions. The degree of integration can be increased accordingly.

Furthermore, in the second embodiment of the invention, the thickness of the semiconductor layer 28 having an opposite conductivity type to that of the substrate 27 can be made far thinner than that of the first embodiment whereby the time period required for the process for insulating and isolating the layers can be minimized.

In addition, it will be apparent that all the technical advantages obtained by the first embodiment can also be obtained by the second embodiment. Since the second embodiment differs from the first embodiment only in the characteristics in the transient state with the characteristics in the stationary conditions being similar to that of the first embodiment, it can find as wide application as the first embodiment.

A semiconductor device having an intermediate characteristic between the first embodiment and the second embodiment may also be fabricated by controlling the thickness and impurity concentration in the semiconductive layer 12. In such a structure, when the current flowing through one of the elements is increasing, the current flowing through the other element is decreasing, thus making the structure equivalent to a feedback circuit. For this reason, the semiconductor device having the intermediate characteristics can also be utilized as a linear circuit device.

As in the case of the first embodiment, the second embodiment need not be of the above-described structure. All the modifications mentioned as to the first embodiment are applicable as well to the second embodiment. The source and drain electrodes in the first and second embodiments may be formed in the Schottky-type contacts instead of the above PN-junction type contacts. In such a case, the extension of the depletion layer can be expressed as $d=[(2\epsilon/qN)V]^{1/2}$ *as disclosed by D. Kahng in* "Bell System Technical Journal," Jan. 1964, on page 215.

Thus, while only several embodiments of the present invention have been herein specifically described, it will be apparent that variations may be made therein, all without departing from the spirit and scope of the invention.

We claim:

1. A field effect semiconductor device comprising a substrate of one conductivity type, a semiconductor layer of the opposite conductivity type formed on said substrate first and second regions of said one conductivity type separately formed in said semiconductor layer, a first source electrode coupled to one of said regions, a first drain electrode coupled to the other of said regions, a gate insulator film covering a part of the surface of said semiconductor layer intermediate said first and second regions, a gate electrode deposited on said gate insulator film, a second source electrode coupled to said semiconductor layer outside an area to which said first source and drain electrodes and said gate insulator film are coupled, a second drain electrode coupled to said semiconductor layer outside said area and at the opposite side to said second source electrode with respect to said gate electrode, a first conduction path being established between said second source electrode and said second drain electrode through said semiconductor layer underlying said gate insulator film, and means for applying a bias voltage to said gate electrode to induce a channel of said opposite conductivity type connecting said first and second regions to each other at the surface of said semiconductor layer underlying said gate insulator film, thereby establishing a second conduction path between said first source electrode and said first drain electrode.

2. The semiconductor device of claim 1, in which said gate electrode and said first source and drain electrodes comprise the electrodes of an operative insulated gate field effect transistor, and said second source and drain electrodes are included in an operative junction-type gate field effect transistor for which the gate is defined by the junction portion of said first source and drain electrodes.

3. The semiconductor device of claim 1, further comprising third and fourth regions of said opposite conductivity type formed in said substrate.

4. The semiconductor device of claim 3, in which said bias voltage applying means is further effective to form a depletion layer interface between said substrate and said semiconductor layer for cutting off conduction between said third and fourth regions.

5. The semiconductor device of claim 4, in which the impurity concentration in said substrate is increased relative to that in said semiconductor layer.

6. The semiconductor device of claim 3, in which said gate electrode and said first and second regions comprise the active elements of a first field effect transistor, and said gate electrode and said third and fourth regions comprise the active elements of a second field effect transistor arranged in a stacked relation with respect to said first field effect transistor.

* * * * *

UNITED STATES PATENT OFFICE
CERTIFICATE OF CORRECTION

Patent No. 3,639,813 Dated February 1, 1972

Inventor(s) Mototaka Kamoshida and Sho Nakanuma

It is certified that error appears in the above-identified patent and that said Letters Patent are hereby corrected as shown below:

Column 6, Claim 4, line 43, "layer interface" should have been -- layer extending to the interface --.

Signed and sealed this 1st day of August 1972.

(SEAL)
Attest:

EDWARD M.FLETCHER,JR.
Attesting Officer

ROBERT GOTTSCHALK
Commissioner of Patents